US012334368B2

(12) United States Patent
Shen et al.

(10) Patent No.: US 12,334,368 B2
(45) Date of Patent: Jun. 17, 2025

(54) LIQUID DELIVERING SYSTEM FOR WAFER CLEANING EQUIPMENT

(71) Applicants: PNC PROCESS SYSTEMS CO., LTD., Shanghai (CN); ULTRON SEMICONDUCTOR (SHANGHAI) CO., LTD., Shanghai (CN)

(72) Inventors: Yilin Shen, Shanghai (CN); Xinlai Chen, Shanghai (CN); Dawei Liu, Shanghai (CN); Jie Wang, Shanghai (CN); Zhengkai Lu, Shanghai (CN); Ming Xu, Shanghai (CN); Panpan Li, Shanghai (CN); Fangyi Lv, Shanghai (CN); Chuanlong Liu, Shanghai (CN)

(73) Assignees: PNC PROCESS SYSTEMS CO., LTD., Shanghai (CN); ULTRON SEMICONDUCTOR (SHANGHAI) CO., LTD., Shanghai (CN)

( * ) Notice: Subject to any disclaimer, the term of this patent is extended or adjusted under 35 U.S.C. 154(b) by 0 days.

(21) Appl. No.: 19/023,785

(22) Filed: Jan. 16, 2025

(65) Prior Publication Data
US 2025/0157832 A1 May 15, 2025

Related U.S. Application Data

(63) Continuation of application No. PCT/CN2023/106072, filed on Jul. 6, 2023.

(30) Foreign Application Priority Data

Dec. 15, 2022 (CN) .......................... 202211617079.3

(51) Int. Cl.
*H01L 21/00* (2006.01)
*B01F 23/40* (2022.01)
(Continued)

(52) U.S. Cl.
CPC ........ *H01L 21/67057* (2013.01); *B01F 23/45* (2022.01); *B01F 23/48* (2022.01);
(Continued)

(58) Field of Classification Search
CPC ........... H01L 21/67057; H01L 21/6704; B01F 23/49; B01F 35/602; B01F 35/92; B01F 2101/58; B01F 2035/99; B01F 2035/98
See application file for complete search history.

(56) References Cited

U.S. PATENT DOCUMENTS

| 5,158,616 | A | * | 10/1992 | Kinoshita | ......... H01L 21/67057 134/32 |
| 2001/0002361 | A1 | * | 5/2001 | Kawashima | ............ B01F 23/49 451/443 |
| 2010/0128555 | A1 | * | 5/2010 | Hughes | ................... B01F 23/49 366/132 |

FOREIGN PATENT DOCUMENTS

| CN | 102755970 A | 10/2012 |
| CN | 111223756 A | 6/2020 |

(Continued)

OTHER PUBLICATIONS

International Search Report of PCT/CN2023/106072, Oct. 20, 2023.

*Primary Examiner* — Anshu Bhatia
(74) *Attorney, Agent, or Firm* — Routman Pepper Locke; Tim Tingkang Xia, Esq.

(57) ABSTRACT

A liquid delivering system for wafer cleaning equipment includes an acid scouring tank, a sulfuric acid supplying source, a hydrogen peroxide supplying source, a first mixing device, a second mixing device and a feedback-control panel. The first mixing device and the second mixing device both includes a mixing duct, a multi-section mixing screw rod arranged inside the mixing duct and a heater wrapped around the mixing duct. By ways of adopting the above-mentioned technical solution, it is possible to realize fully (Continued)

mixing sulfuric acid with hydrogen peroxide in a mode of mixing in multi-stages, achieve precise control to temperature, and enable mixed liquid to fully react, thereby ensuring that the mixed liquid coming into the acid scouring tank meets cleaning requirements, and improving quality and efficiency of cleaning wafers.

7 Claims, 3 Drawing Sheets

(51) Int. Cl.
    *B01F 23/45*     (2022.01)
    *B01F 25/4314*     (2022.01)
    *B01F 35/21*     (2022.01)
    *B01F 35/22*     (2022.01)
    *B01F 35/221*     (2022.01)
    *B01F 35/60*     (2022.01)
    *B01F 35/92*     (2022.01)
    *H01L 21/67*     (2006.01)
    *B01F 35/90*     (2022.01)
    *B01F 101/58*     (2022.01)

(52) U.S. Cl.
CPC ........ *B01F 23/49* (2022.01); *B01F 25/43141* (2022.01); *B01F 35/2113* (2022.01); *B01F 35/2115* (2022.01); *B01F 35/2132* (2022.01); *B01F 35/2202* (2022.01); *B01F 35/2217* (2022.01); *B01F 35/602* (2022.01); *B01F 35/92* (2022.01); *B01F 2035/98* (2022.01); *B01F 2035/99* (2022.01); *B01F 2101/58* (2022.01)

(56) References Cited

FOREIGN PATENT DOCUMENTS

| | | |
|---|---|---|
| CN | 114054421 A | 2/2022 |
| CN | 114496849 A | 5/2022 |
| CN | 115831822 A | 3/2023 |
| CN | 115938990 A | 4/2023 |
| JP | H05166780 A | 7/1993 |
| KR | 20180051871 A | 5/2018 |

\* cited by examiner

LIQUID DELIVERING SYSTEM FOR WAFER CLEANING EQUIPMENT

CROSS-REFERENCE TO RELATED PATENT APPLICATION

This application is a continuation application of International Application No. PCT/CN2023/106072, filed on Jul. 6, 2023, which itself claims priority to Chinese Patent Application No. 202211617079.3, filed on Dec. 15, 2022. The disclosure of each of the above-mentioned applications is hereby incorporated by reference.

FIELD OF THE INVENTION

The present invention relates to wafer cleaning processes in the technical field of wafer fabrication, in particular to a liquid delivering system for wafer cleaning equipment.

BACKGROUND OF THE INVENTION

In the process of cleaning semiconductor wafers, a tank-type cleaning device as special equipment is commonly used for cleaning chemicals off wafers, and so far, some technical solutions suitable for different processes of cleaning wafers have been provided for different wafer products in use. In each of various processes commonly used for cleaning wafers, such as a process of removing films, a process of degumming, a process of cleaning organic compounds off wafers, and a process of removing some metal surface structures or metal residues, it is often necessary to use an active SPM-peroxy-sulfuric acid mixture solution formed by mixing sulfuric acid ($H_2SO_4$) with hydrogen peroxide ($H_2O_2$) and ultrapure water in relative concentration at a specified ratio to clean wafers, for example, to clean wafers with various active SPM-peroxy-sulfuric acid mixture solutions such as SPM or DSP+ formed by adding ozone water. The active SPM-peroxy-sulfuric acid mixture solution will exert corrosive action upon any of various semiconductor materials such as silicon (Si), silicon carbide (SiC), gallium nitride (GaN) and gallium arsenide (GaAs), and common metals and various organic compounds with loose molecular chain structure, so as to achieve the functions of cleaning, etching and removal, so it is often used in the processes of cleaning semiconductor wafers.

For a process of cleaning with SPM adapted to tank-type devices, a source pipe used for correspondingly supplying sulfuric acid ($H_2SO_4$), hydrogen peroxide ($H_2O_2$) and ultrapure water leads from a corresponding pipe to a corresponding acid scouring tank via a delivering pipe, a circulation pipe, a circulation pump, a filter, a rear mixer, a temporarily storing tank and a rear feeding-out pipe that are corresponding to these two pipes respectively, so as to perform preparatory actions for cleaning. However, problems such as unevenness in mixture, large error in temperature control, and inadequacy in reaction still occur in this delivering process. These problems will lead to fatal defects in the process of cleaning with SPM adapted to tank-type devices, resulting in a decrease in capability of cleaning.

SUMMARY OF THE INVENTION

Therefore, the technical problem to be solved by the present invention is how to provide a liquid delivering system for wafer cleaning equipment, which achieves evenness in mixture, preciseness in temperature control, and adequacy in reaction, so as to overcome the defects existing in the prior art.

In order to solve the above-mentioned technical problem, the present invention adopts the following technical solution.

A liquid delivering system for wafer cleaning equipment includes an acid scouring tank, a sulfuric acid supplying source and a hydrogen peroxide supplying source, characterized in that the system further includes a first mixing device, a second mixing device and a feedback-control panel.

The first mixing device and the second mixing device both includes a mixing duct, a multi-section mixing screw rod arranged inside the mixing duct and a heater wrapped around the mixing duct.

Two principal inlets of the first mixing device lead to the sulfuric acid supplying source and the hydrogen peroxide supplying source through a principal sulfuric acid pipe and a principal hydrogen peroxide pipe, respectively; one principal inlet of the second mixing device leads to one principal outlet of the first mixing device; two ancillary inlets of the second mixing device lead to the sulfuric acid supplying source and the hydrogen peroxide supplying source through a sulfuric acid adjusting pipe and a hydrogen peroxide adjusting pipe, respectively; a principal outlet of the second mixing device leads to the acid scouring tank.

A thermometer and an oxygen concentration meter are arranged on both of the principal outlet of the first mixing device and the principal outlet of the second mixing device; a flow valve is arranged on each of the principal sulfuric acid pipe, the principal hydrogen peroxide pipe, the sulfuric acid adjusting pipe and the hydrogen peroxide adjusting pipe.

The heater, the thermometer, the oxygen concentration meter and the flow valve are electrically connected to the feedback-control panel.

In a specific mode of realizing the present invention, the system further includes a third mixing device and a cooling circulation device, the third mixing device includes a mixing duct, a multi-section mixing screw rod arranged inside the mixing duct, a heater wrapped around the mixing duct and a cooling passage; a principal inlet of the third mixing device leads to the principal outlet of the second mixing device; the principal inlet of the third mixing device leads to the acid scouring tank; the cooling passage is provided with a coolant inlet and a coolant outlet, and the coolant inlet and the coolant outlet lead to an outlet end and an inlet end of the cooling circulation device through the cooling passage, respectively; the cooling circulation device is electrically connected to the feedback-control panel, and a principal outlet of the third mixing device is also provided with a thermometer and an oxygen concentration meter that are electrically connected to the feedback-control panel.

In a specific mode of realizing the present invention, the system further includes an auxiliary heater that is electrically connected to the feedback-control panel, an inlet of the auxiliary heater leads to the principal outlet of the third mixing device, and an outlet of the auxiliary heater leads to the acid scouring tank.

In a specific mode of realizing the present invention, the system further includes a SPM storage tank; the principal outlet of the first mixing device leads to the principal inlet of the second mixing device and a first inlet of the SPM storage tank through a three-way valve, respectively; the principal outlet of the second mixing device leads to the principal inlet of the third mixing device and a second inlet of the SPM storage tank through a three-way valve, respectively; the principal outlet of the third mixing device leads to the inlet of the auxiliary heater and a third inlet of the SPM storage tank through a three-way valve, respectively; an outlet of the SPM storage tank and the outlet of the auxiliary heater respectively lead to the acid scouring tank through a three-way valve.

In a specific mode of realizing the present invention, the four three-way valves are electrically connected to the feedback-control panel.

In a specific mode of realizing the present invention, a pressure gauge and a pressure relief valve that lead to the interior of the mixing duct are arranged on each of the first mixing device, the second mixing device and the third mixing device, and the pressure gauge and the pressure relief valve are electrically connected to the feedback-control panel.

In a specific mode of realizing the present invention, the heater is provided as a heating tube wrapped around the mixing duct; the first mixing device and the second mixing device each further have a heat preservation layer covering the heating tube; the cooling passage inside the third mixing device is positioned outside the heating tube; the third mixing device further has a heat preservation layer wrapped around the cooling passage.

In the present invention, by ways of adopting the above-mentioned technical solution, it is possible to realize fully mixing sulfuric acid with hydrogen peroxide in a mode of mixing in multi-stages, achieve precise control to temperature, and enable mixed liquid to fully react, thereby ensuring that the mixed liquid coming into the acid scouring tank meets cleaning requirements, and improving quality and efficiency of cleaning wafers.

DETAILED DESCRIPTION OF SOME EMBODIMENTS

Figure 1:
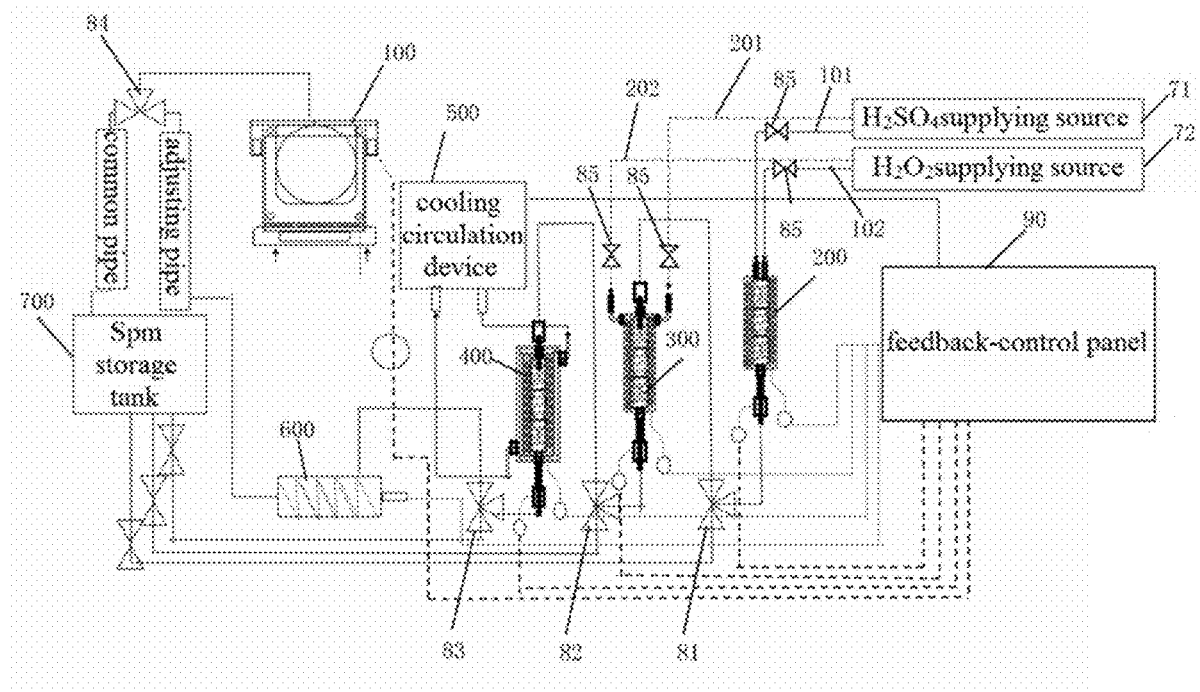
FIG. 1 is a structure diagram of the system according to the present invention.

As shown in FIG. 1, the liquid delivering system for wafer cleaning equipment according to the present invention includes an acid scouring tank 100, a first mixing device 200, a second mixing device 300, a third mixing device 400, a cooling circulation device 500, a SPM storage tank 700, an auxiliary heater 600 and a feedback-control panel 90.

Figure 2:
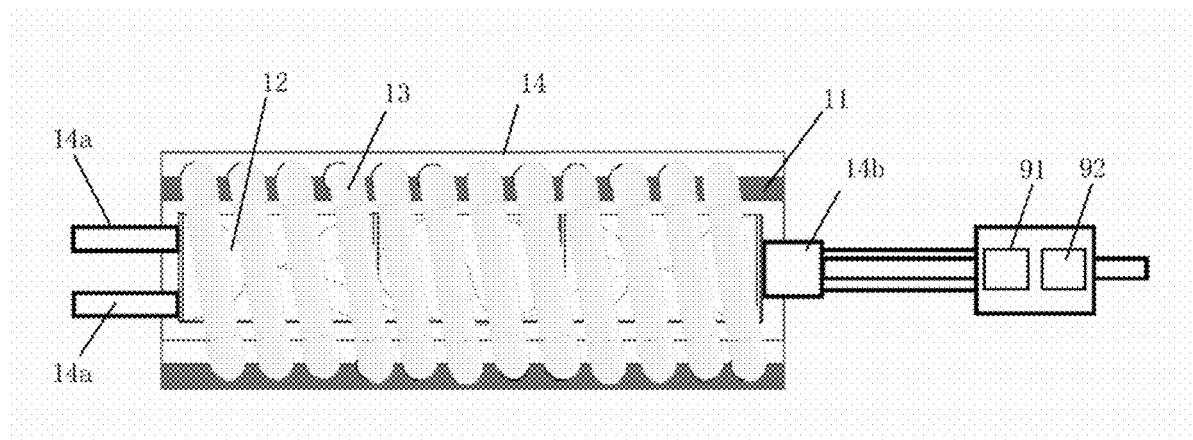
FIG. 2 is a structure diagram of the first mixing device according to the present invention.
Figure 3:
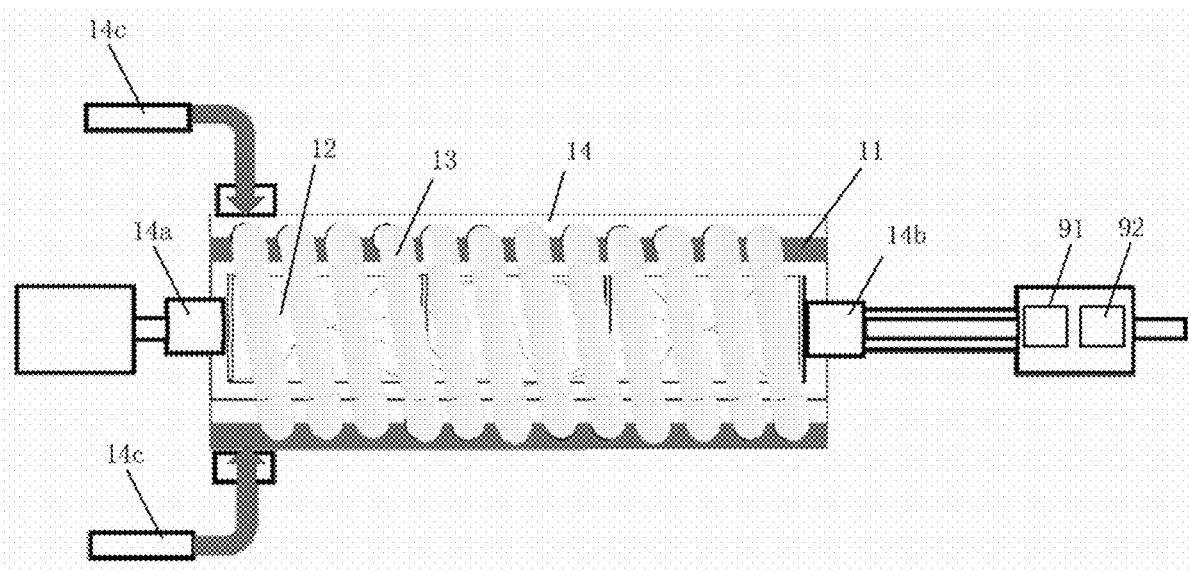
FIG. 3 is a structure diagram of the second mixing device according to the present invention.
Figure 4:
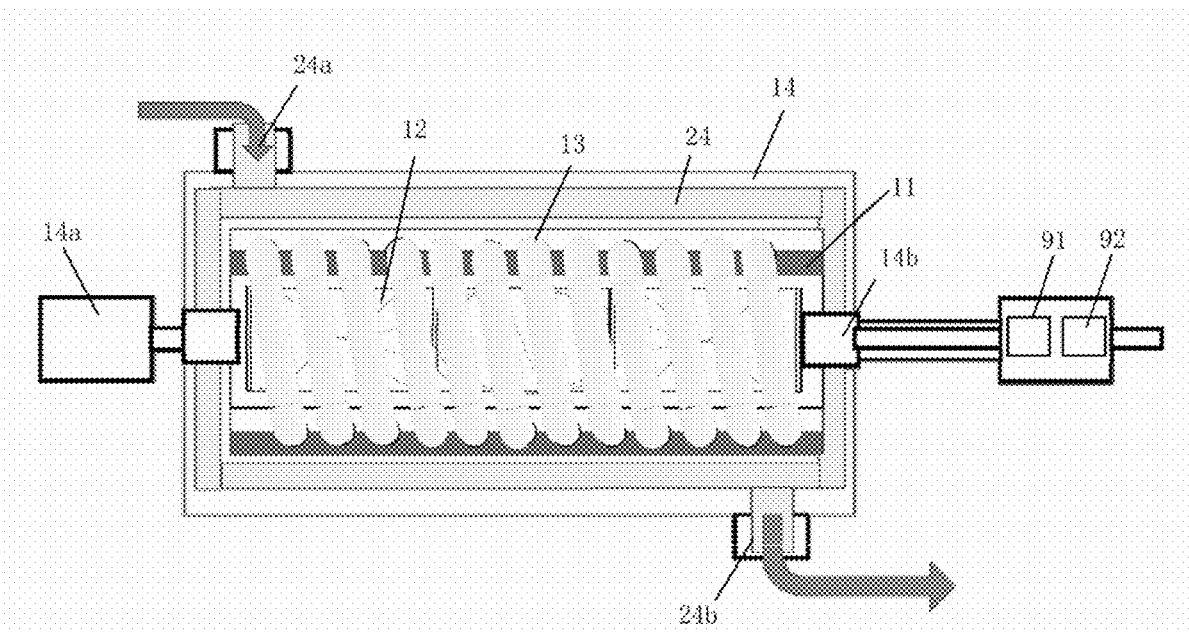
FIG. 4 is a structure diagram of the third mixing device according to the present invention.

As shown in FIGS. 2-4, the first mixing device 200, the second mixing device 300 and the third mixing device 400 each include a mixing duct 11, a multi-section mixing screw rod 12 arranged inside the mixing duct 11, a heater 13 wrapped around the mixing duct 11 and a heat preservation layer 14 positioned outside the heater 13. The heater 13 in this example is a heating tube wrapped around the mixing duct 11.

As shown by ways of combining FIG. 1 with FIG. 2, two principal inlets 14a are set on the inlet end of the first mixing device 200, and one principal outlet 14b is arranged on the outlet end of the first mixing device 200; two principal inlets 14a of the first mixing device 200 lead to a sulfuric acid supplying source 71 and a hydrogen peroxide supplying source 72 through a principal sulfuric acid pipe 101 and a principal hydrogen peroxide pipe 102, respectively; a flow valve 85 is arranged on each of the principal sulfuric acid pipe 101 and the principal hydrogen peroxide pipe 102.

As shown by ways of combining FIG. 1 with FIG. 3, one principal inlet 14a and two ancillary inlets 14c are set on the inlet end of the second mixing device 300; a principal outlet 14b is set on the outlet end of the second mixing device 300; the two ancillary inlets 14c of the second mixing device 300 lead to the sulfuric acid supplying source 71 and the hydrogen peroxide supplying source 72 through a sulfuric acid adjusting pipe 201 and a hydrogen peroxide adjusting pipe 202, respectively; the principal inlet 14a of the second mixing device 300 leads to the principal outlet 14b of the first mixing device 200 through a principal pipe; a flow valve 85 is arranged on each of the sulfuric acid adjusting pipe 201 and the hydrogen peroxide adjusting pipe 202.

As shown by ways of combining FIG. 1 with FIG. 4, the third mixing device 400 is provided with a cooling circulation passage 24 between the heating tube 13 and the heat preservation layer 14. One principal inlet 14a is set on an inlet end of the third mixing device 400, and one principal outlet 14b is set on an outlet end of the third mixing device 400. The cooling passage 24 is provided with a coolant inlet 24a and a coolant outlet 24b; the coolant inlet 24a and the coolant outlet 24b lead to an outlet end and an inlet end of the cooling circulation device 500 through the cooling passage, respectively.

The principal outlet 14b of the first mixing device 200 leads to the principal inlet 14a of the second mixing device 300 and a first inlet of the SPM storage tank 700 through a first three-way valve 81, respectively.

The principal outlet 14b of the second mixing device 300 leads to the principal inlet 14a of the third mixing device 400 and a second inlet of the SPM storage tank 700 through a second three-way valve 82, respectively.

The principal outlet 14b of the third mixing device 400 leads to an inlet of the auxiliary heater 600 and a third inlet of the SPM storage tank 700 through a third three-way valve 83, respectively.

An outlet of the SPM storage tank 700 and an outlet of the auxiliary heater 600 respectively lead to the acid scouring tank 100 through a fourth three-way valve 84.

The feedback-control panel 90 is electrically connected to the cooling circulation device 500, and used to control the cooling circulation device 500 to feed a circulating coolant into the third mixing device 400, so as to cool overheating mixed liquid that has come into the third mixing device 400, and enable the temperature of the mixed liquid to descend to a suitable value.

Figure 5:
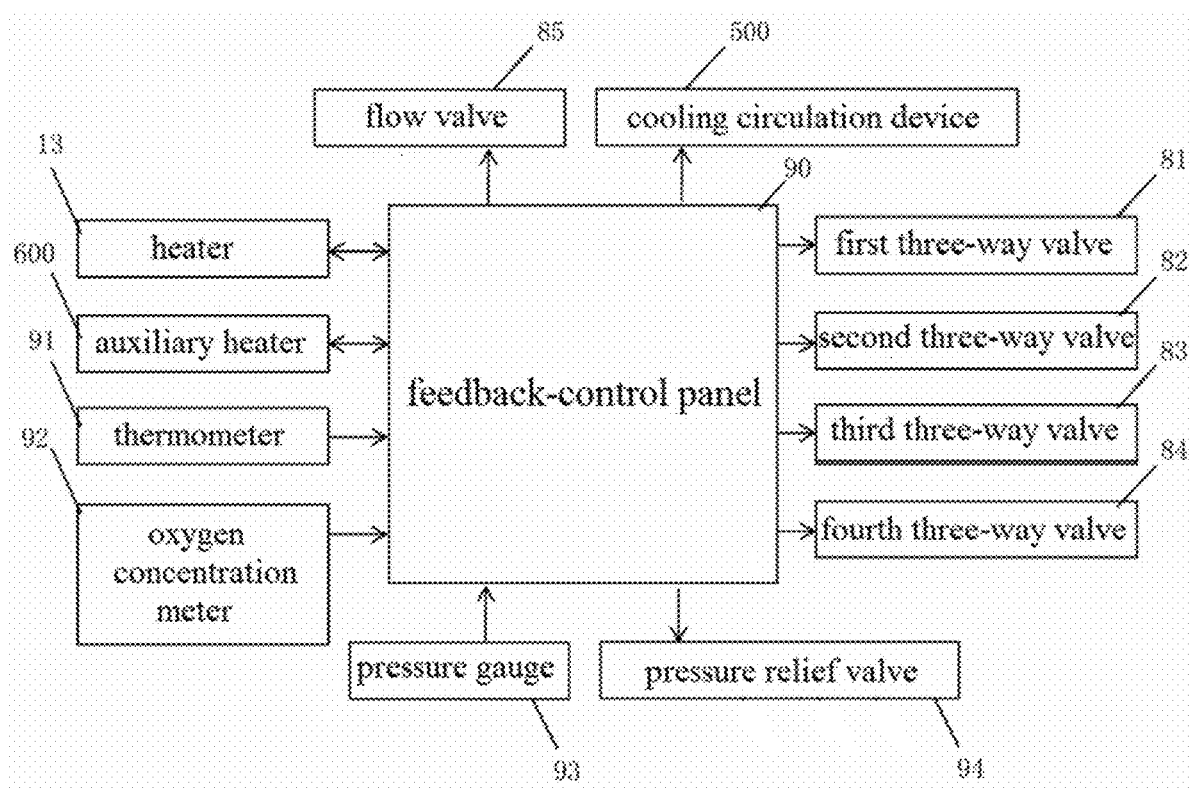
FIG. 5 is a block diagram showing an electrical connection of feedback-control in the present invention.

As shown in FIG. 5, the feedback-control panel 90 is electrically connected to each of the heater 13 of the first mixing device 200, the heater 13 of the second mixing device 300, the heater 13 of the third mixing device 400 and the auxiliary heater 600, in this way the feedback-control panel 90 can get the temperature values from feedback of these three heaters 13 and the auxiliary heater 600, and can simultaneously control these three heaters 13 and the auxiliary heater 600 to perform heating.

A thermometer 91 and an oxygen concentration meter 92 are arranged on each of the principal outlet of the first mixing device 200, the principal outlet of the second mixing device 300 and the principal outlet of the third mixing device 400, and inside the acid scouring tank 100; a pressure gauge 93 and a pressure relief valve 94 that lead to the interior of the mixing duct 11 are arranged on each of the first mixing device 200, the second mixing device 300 and the third mixing device 400; these thermometers 91, oxygen concentration gauges 92, pressure gauges 93 and pressure relief valves 94 are also electrically connected to the feedback-control panel 90.

The first, second, third and fourth three-way valves 81, 82, 83, 84 and the four flow valves 85 are also each electrically connected to feedback-control panel 90.

The liquid delivering system for wafer cleaning equipment according to the present invention was described above, and its operation mode is as follows.

The sulfuric acid from the sulfuric acid supplying source 71 and the hydrogen peroxide form the hydrogen peroxide supplying source 72 are respectively delivered at a specified ratio into the mixing duct 11 of the first mixing device 100 via the principal sulfuric acid pipe 101 and the principal hydrogen peroxide pipe 102, and the sulfuric acid and the hydrogen peroxide at the time of gathering together collide with the spiral plane of the mixing screw rod 12 and make it rotate, in this way the shear force arising from this rotation can make the sulfuric acid and the hydrogen peroxide permeate through each other, and finally make the sulfuric acid and the hydrogen peroxide mix fully and evenly under the action of collision and rotation from the multi-section mixing screw rod. In the process of mixing, the heater of the first mixing device 200 heats the mixed liquid inside the pipe, and in the process of heating, on the one hand, the heater feeds back heating temperature to the feedback-control panel 90; on the other hand, the feedback-control panel 90 controls the heating temperature of the heater according to the feedback temperature.

The temperature and the oxygen concentration of the mixed liquid flowing out from the first mixing device 200 are respectively detected and fed back to the feedback-control panel 90 by means of the thermometer 91 and the oxygen concentration meter 92 arranged at the principal outlet of the first mixing device 200. If the temperature is lower than a required temperature value, the feedback-control panel 90 continues to control the heater of the second mixing device 300 to heat the mixed liquid flowing inside at the same moment that the second mixing device 300 further mixes the mixed liquid; if the oxygen concentration value is lower than a required concentration value, indicating inadequacy in reaction, thus the feedback-control panel 90 opens the flow valves on the sulfuric acid adjusting pipe 201 and the hydrogen peroxide adjusting pipe 202 to increase the fed-in volumes of sulfuric acid and hydrogen peroxide at a specified ratio toward the second mixing device 300 so as to enable a complete reaction.

The temperature of the mixed liquid flowing out from the second mixing device 300 is further detected and fed back to the feedback-control panel 90 by means of the thermometer 91 arranged at the principal outlet of the second mixing device 300. If the temperature is higher than a required temperature value, the feedback-control panel 90 controls the cooling circulation device to feed a circulating coolant into the cooling passage inside the third mixing device 400, so as to cool the mixed liquid; if the temperature is lower than a required temperature value, the feedback-control panel 90 controls the heater of the third mixing device 300 to heat the mixed liquid.

The temperature of the mixed liquid flowing out from the third mixing device 400 is further detected and fed back to the feedback-control panel 90 by means of the thermometer 91 arranged at the principal outlet of the third mixing device 400. If the temperature is lower than a required temperature value, the feedback-control panel 90 controls the auxiliary heater 600 to heat the mixed liquid, so as to make the mixed liquid finally meet the required temperature value.

The oxygen concentration of the mixed liquid flowing out is detected and fed back to the feedback-control panel 90 by means of the oxygen concentration meter 92 arranged at the principal outlet of the second mixing device 300 and the oxygen concentration meter 92 arranged at the principal outlet of the third mixing device 400. If an oxygen concentration value detected at any device is lower than a required concentration value, the feedback-control panel 90 opens the flow valves on the sulfuric acid adjusting pipe 201 and the hydrogen peroxide adjusting pipe 202 to increase the fed-in volumes of sulfuric acid and hydrogen peroxide at a specified ratio toward the second mixing device 300 so as to enable a complete reaction.

In the process of mixing, the pressure gauge monitors the pressure values in the first mixing device 200, the second mixing device 300 and the third mixing device 400 and feeds them back to the feedback-control panel 90. Once a gas pressure value in one of these mixing devices exceeds a set value, the feedback-control panel 90 can control the pressure relief valve arranged on this mixing device to open and relieve pressure, so as to guarantee system safety.

If the mixed liquid fed out from any mixing device is fully mixed and the temperature and oxygen concentration values respectively meet a required value, the mixed liquid can be directly delivered to the SPM storage tank for storage in heat preservation by the way of switching the first three-way valve 81, the second three-way valve 82 and the third three-way valve 83 of a corresponding mixing device.

It is possible to further decide whether the mixed liquid is supplied to the acid scouring tank 100 from the SPM storage tank 700 or directly through an adjusting pipe by the way of switching the fourth three-way valve 84.

By ways of describing the present invention in detail above, it can be seen that it is possible to realize fully mixing sulfuric acid with hydrogen peroxide in a mode of mixing in multi-stages, achieve precise control to temperature, and enable mixed liquid to fully react, thereby ensuring that the mixed liquid coming into the acid scouring tank meets cleaning requirements, and improving quality and efficiency of cleaning wafers.

What is claimed is:

1. A liquid delivering system for wafer cleaning equipment comprising an acid scouring tank, a sulfuric acid supplying source and a hydrogen peroxide supplying source, characterized in that the system further comprises a first mixing device, a second mixing device, a feedback-control panel, a third mixing device and a cooling circulation device;

said first mixing device and said second mixing device both includes a mixing duct, a multi-section mixing screw rod arranged inside said mixing duct and a heater wrapped around said mixing duct;

two principal inlets of said first mixing device lead to said sulfuric acid supplying source and said hydrogen peroxide supplying source through a principal sulfuric acid pipe and a principal hydrogen peroxide pipe, respectively; one principal inlet of said second mixing device leads to one principal outlet of said first mixing device; two ancillary inlets of said second mixing device lead to said sulfuric acid supplying source and said hydrogen peroxide supplying source through a sulfuric acid adjusting pipe and a hydrogen peroxide adjusting pipe, respectively; a principal outlet of said second mixing device leads to said acid scouring tank;

a thermometer and an oxygen concentration meter are arranged on both of the principal outlet of said first mixing device and the principal outlet of said second mixing device; a flow valve is arranged on each of said principal sulfuric acid pipe, said principal hydrogen peroxide pipe, said sulfuric acid adjusting pipe and said hydrogen peroxide adjusting pipe;

said third mixing device includes a mixing duct, a multi-section mixing screw rod arranged inside said mixing duct, a heater wrapped around said mixing duct and a cooling passage; a principal inlet of said third mixing device leads to the principal outlet of said second mixing device; the principal inlet of said third mixing device leads to said acid scouring tank; said cooling passage is provided with a coolant inlet and a coolant outlet, and said coolant inlet and said coolant outlet lead to an outlet end and an inlet end of said cooling circulation device through said cooling passage, respectively; and said heater, said thermometer, said oxygen concentration meter, said cooling circulation device and said flow valve are electrically connected to said feedback-control panel; and a principal outlet of said third mixing device is also provided with a thermometer and an oxygen concentration meter that are electrically connected to said feedback-control panel.

2. The liquid delivering system for wafer cleaning equipment according to claim 1, characterized in that the system further comprises an auxiliary heater that is electrically connected to said feedback-control panel, an inlet end of said auxiliary heater leads to the principal outlet of said third mixing device, and an outlet end of said auxiliary heater leads to said acid scouring tank.

3. The liquid delivering system for wafer cleaning equipment according to claim 2 characterized in that the system further comprises a storage tank; the principal outlet of said first mixing device leads to the principal inlet of said second mixing device and a first inlet of said storage tank through a three-way valve, respectively; the principal outlet of said second mixing device leads to the principal inlet of said third mixing device and a second inlet of said storage tank through a three-way valve, respectively; the principal outlet of said third mixing device leads to the inlet end of said auxiliary heater and a third inlet of said storage tank through a three-way valve, respectively; and an outlet of said storage tank and the outlet end of said auxiliary heater respectively lead to said acid scouring tank through a three-way valve.

4. The liquid delivering system for wafer cleaning equipment according to claim 3, characterized in that these four three-way valves are electrically connected to said feedback-control panel.

5. The liquid delivering system for wafer cleaning equipment according to claim 3, characterized in that a pressure gauge and a pressure relief valve that lead to the interior of said mixing duct are arranged on each of said first mixing device, said second mixing device and said third mixing device, and said pressure gauge and said pressure relief valve are electrically connected to said feedback-control panel.

6. The liquid delivering system for wafer cleaning equipment according to claim 3, characterized in that said heater is provided as a heating tube wrapped around said mixing duct; said first mixing device and said second mixing device each further have a heat preservation layer covering said heating tube; said cooling passage inside said third mixing device is positioned outside said heating tube; and said third mixing device further has a heat preservation layer wrapped around said cooling passage.

7. The liquid delivering system for wafer cleaning equipment according to claim 3, characterized in that a thermometer and an oxygen concentration meter that are electrically connected to said feedback-control panel are arranged inside said acid scouring tank.

\* \* \* \* \*